United States Patent [19]

Sato

[11] Patent Number: 5,363,793
[45] Date of Patent: Nov. 15, 1994

[54] METHOD FOR FORMING CRYSTALS

[75] Inventor: Nobuhiko Sato, Atsugi, Japan

[73] Assignee: Canon Kabushiki Kaisha, Tokyo, Japan

[21] Appl. No.: 100,188

[22] Filed: Aug. 2, 1993

Related U.S. Application Data

[63] Continuation of Ser. No. 669,778, Mar. 14, 1991, abandoned.

[30] Foreign Application Priority Data

Apr. 6, 1990 [JP] Japan .................................. 2-090442

[51] Int. Cl.$^5$ .............................................. C30B 25/02
[52] U.S. Cl. .......................................... 117/2; 117/902
[58] Field of Search ..... 156/612, 613, 614, DIG. 111; 437/DIG. 83; 148/DIG. 52

[56] References Cited

U.S. PATENT DOCUMENTS 3,620,833  11/1971  Gheim ................................ 148/174

FOREIGN PATENT DOCUMENTS 0307108  3/1989  European Pat. Off. .
0339793  11/1989  European Pat. Off. .
107016  5/1988  Japan .

Primary Examiner—R. Bruce Breneman
Assistant Examiner—Felisa Garrett
Attorney, Agent, or Firm—Fitzpatrick, Cella, Harper & Scinto

[57] ABSTRACT

A method of forming crystals is adapted to grow a single-crystal by subjecting a substrate having a free surface with mutually adjacent non-nucleation and nucleation surfaces to a crystal forming process. Each nucleation surface consists of an amorphous material, having a greater nucleation density than the non-nucleation surface, with respect to a material with which the single-crystal will be formed, and having an area sufficiently small to permit only one nucleus to be generated, which will grow into the single crystal. The non-nucleation surfaces are made of a material having a higher etching rate than the material of which the nucleation surfaces are made. After a process of implanting ions in the entire surface of the substrate, the resultant substrate is subjected to an etching process whereby the non-nucleation surface material alone is selectively etched to remove the unnecessarily ion-implanted portions of the material. Thus, in the ion implantation, which is performed without employing a resist and followed by selective etching, a great amount of ions can be implanted without involving the conventional problems and without complicating the method. Therefore, it is possible to achieve a sufficiently great difference in nucleation density between the nucleation and non-nucleation surfaces, thereby increasing the yield of crystal growth.

5 Claims, 8 Drawing Sheets

METHOD FOR FORMING CRYSTALS

This application is a continuation of application Ser. No. 07/669,778 filed Mar. 14, 1991 now abandoned.

BACKGROUND OF THE INVENTION (1) Field of the Invention

The present invention relates to a method of forming a crystal, particularly to a crystal forming method for growing a single-crystal by subjecting a substrate having a free surface on which a non-nucleation surface and a nucleation surface are arranged adjacent to each other to a crystal forming process. The nucleation surface has a greater nucleation density than the non-nucleation surface with respect to a material with which the single-crystal will be formed. The nucleation surface has an area sufficiently small to selectively permit only one nucleus to form, which will grow to form a single-crystal. The method of the present invention forms a crystal which is used, for example, as an electronic, optical, magnetic, piezoelectric or surface acoustic element of a semiconductor integrated circuit, an optical integrated circuit, or a magnetic circuit.

(2) Related Background Art

This application is an improvement in the process for forming a single crystal on an insulating substrate as described in copending application Ser. No. 07/409,284, filed Sep. 19, 1989, the disclosure of which is incorporated herein by reference.

In the prior art, single crystal thin films to be used for semiconductor electronic devices or optical devices have been formed by epitaxial growth on a single crystal substrate. For example, it is known that epitaxial growth of Si, Ge, GaAs, etc., can be performed from the liquid phase, gas phase or solid phase on Si single crystal substrate (silicon wafer), and it is also known that epitaxial growth of a single crystal such as GaAs, GaAlAs, etc., occurs on a GaAs single crystal substrate. By use of the semiconductor thin film thus formed, semiconductor devices and integrated circuits, electroluminescent devices such as semiconductor lasers or LED have been prepared.

Also, much research and development has been recently conducted concerning ultra-high speed transistors by use of two-dimensional electronic gas, ultra-lattice devices utilizing quantum well, etc. What has made such research possible is the high precision epitaxial technique such as MBE (molecular beam epitaxy) or MOCVD (organometallic chemical vapor deposition) by use of ultra-high vacuum.

In such epitaxial growth on a single crystal substrate, it is necessary to take into account matching of lattice constants and coefficient of thermal expansion between the single crystal material of the substrate and the epitaxial growth layer. For example, although it is possible to effect epitaxial growth of Si single crystal film on sapphire which is an insulating single crystal substrate, the crystal lattice defect at the interface due to deviation in lattice constant and diffusion of aluminum which is a component of sapphire to the epitaxial layer pose problems in application to electronic devices or circuits.

Thus, the method for forming a single crystal thin film of the prior art by epitaxial growth may be understood to De dependent greatly on its substrate material. Mathews et have examined combinations of the substrate material with epitaxial growth layer (EPITAXIAL GROWTH, Academic Press, New York, 1975, ed. by J. W. Mathews).

The growth of a crystalline silicon on a crystalline silicon substrate is essentially two-dimensional growth, which is formed layer-by-layer by atomic arrangement on the lattice of the single crystal substrate.

Accordingly, during epitaxial growth on a single crystal, the presence of matching lattice constants and matching coefficients of thermal expansion between the single crystal material and the epitaxial growth layer make possible the formation of a uniform single crystal. The order in the single crystal substrate is carried over and matched during epitaxial growth.

To the contrary, when a material is deposited on a chemically dissimilar substrate, there is a lack of matching lattice constants and a lack of matching coefficients of thermal expansion. That lack causes a disordered growth. Accordingly, when a layer is grown over an amorphous substrate, the structure in the overlayers will also be amorphous, or polycrystalline at best. The absence of long-range order in the amorphous substrate is reflected in the absence of long-range order in the overlayer. In general, when a material is grown on a chemically dissimilar substrate, the growth sequence generally observed is nucleation, coalescence of the nuclei and then recrystallization. That nucleation-coalescence-recrystallization sequence in any subsequent grain growth will produce an overlayer without long range order. Generally, such overlayers are amorphous overlayers, or, at best, polycrystalline overlayers, which are aggregates of small random-sized crystal grains with grain boundaries between adjacent grains.

Both silicon oxides and silicon nitrides are stable amorphous materials, which have been widely used for silicon integrated circuit processing. Such amorphous compounds are formed by chemical vapor deposition. When silicon was deposited on amorphous silicon oxide, or amorphous silicon nitride, an amorphous layer or at best, a polycrystalline silicon layer, was formed with a variety of grain sizes. That is because the silicon layer was formed by spontaneous nucleation, coalescence and recrystallization. In that disordered system, the crystal grain boundary locations were randomly determined, since the silicon nuclei were randomly formed over the substrate surface. Closely located nuclei formed small grains, while more remote nuclei formed larger grains due to the difference in time before interaction with adjacent grains.

The formation of that heterogeneous structure having random polycrystalline grains was an obstacle to applying amorphous materials for production of crystal electronic devices. The nonuniform grain boundaries acted as electrical potential barriers and degraded the characteristics of the device.

Also, the size of the substrate is presently about 6 inches for a Si wafer, and the enlargement of GaAs and sapphire substrate is further inhibited. In addition, since the single crystal substrate is high in production cost, the cost per chip becomes higher.

Thus, for production of a single crystal layer capable of use in a device of good quality according to the method of prior art, it is a problem that the kinds of the substrate materials are limited to an extremely narrow scope.

On the other hand, research and development of three-dimensional integrated circuits to accomplish high integration and multi-function by laminating semiconductor devices in the normal line direction of the substrate have been made often in recent years. Also, research and development of large area semiconductor devices such as solar batteries or switching transistors of liquid crystal picture elements, etc, in which devices are arranged in an array on a cheap glass, are becoming more common from year to year.

What is common to both of these is that the technique for forming a semiconductor thin film on an amorphous insulating material and forming an electronic device such as transistor, etc. thereon is required. Among them, particularly the technique for forming a single crystal semiconductor of high quality on an amorphous insulating material has been desired.

Generally speaking, when a thin film is deposited on an amorphous insulating material substrate such as $SiO_2$, etc., due to the defect of long distance order of the substrate material, the crystal structure of the deposited film becomes amorphous or polycrystalline. Here, the amorphous film refers to a state in which near distance order to the extent of the closest atoms is preserved, but no longer distance order exists, while the polycrystalline film refers to single crystal grains having no specific crystal direction gathered as separated at the grain boundaries.

For example, in the case of forming Si on $SiO_2$, according to the CVD method, if the deposition temperature is abut 600° C. or lower, it becomes an amorphous silicon, while it becomes a polycrystalline silicon with grain sizes distributed between some hundred to some thousand Å at a temperature higher than said temperature. However, the grain sizes and their distribution of polycrystalline silicon will be varied greatly depending on the formation method.

Further, by melting and solidifying an amorphous or polycrystalline film by an energy beam such as laser or rod-shaped heater, etc., a polycrystalline thin film with great grain sizes of some microns or millimeters has been obtained (Single crystal silicon on non-single-crystal insulator, Journal of Crystal Growth, vol., 63, No. 3, Oct. 1983, edited by G. W. Gullen).

When a transistor is formed on the thus formed thin film of respective crystal structures and electron mobility is measured from its characteristics, mobility of about 0.1 $cm^2/V \cdot sec$ or less is obtained for amorphous silicon, mobility of 1 to 10 $cm^2/V \cdot sec$ for polycrystalline silicon. having grain sizes of some hundred Å, and a mobility to the same extent as in the case of single crystalline silicon for polycrystalline silicon with great grain sizes by melting and solidification.

From these results, it can be understood that there is great difference in electrical properties between the device formed in the single crystal region within the crystal grains and the device formed as bridging across the grain boundary. In other words, the deposited film on the amorphous material obtained in the prior art becomes amorphous or polycrystalline structure having grain size distribution, and the device prepared thereon is greatly inferior in its performance as compared with the device prepared on the single crystal layer. For this reason, the uses are limited to simple switching devices, solar batteries, photoelectric converting devices, etc.

On the other hand, the method for forming a polycrystalline thin film with great grain sizes by melting and solidification had problems. A great deal of time is required to form the film due to scanning of amorphous or single crystal thin film with energy beam for every wafer. Therefore, that technique is poor in bulk productivity, and also, it is not suited for area enlargement.

Further, in recent years, studies of diamond thin film growth are becoming popular. Diamond thin film, which is particularly broad in bandgap as 5.5 eV as the semiconductor, can be actuated at higher temperature (about 500° C. or less) as compared with Si, Ge, GaAs, etc., which are semiconductor materials of the prior art. Also, the carrier mobility of both electrons and positive holes surpass that of Si (1800 $cm^2/V \cdot sec$ from electrons, 1600 $cm^2/V \cdot sec$ for positive holes), and thermal conductivity is also extremely high. For this reason, it has been expected to be promising for application in semiconductor devices of the great consumption power type with great heat generation quantity.

However, although there have been reports in the prior art about epitaxial growth of diamond thin film on a diamond substrate by vapor phase growth (N. Fujimoto, T. Imai and A. Doi Pro. of Int. Couf. IPAT), there is no successful report about heteroepitaxial growth on a substrate other than diamond substrate.

Generally speaking, diamond nuclei are generated by utilizing excitation with microwaves, using a hydrocarbon type gas such as $CH_4$, etc., and by irradiation with a hot filament or an electron beam, but the nucleation density is generally low, whereby a continuous thin film can only De obtained with difficulty. Even if a continuous thin film may be formed, it has a polycrystalline structure with great grain size distribution and is difficult to apply for semiconductor devices.

Also, as long as a diamond substrate is used, it is expensive as a matter of course, posing also a problem in enlargement of area. Thus, it is not suitable for practical application.

As described above, in the crystal growth method of the prior art and for the crystal formed thereby, three-dimensional integration or enlargement of area could not be done with ease, was difficultly applied in practice for devices, and crystals such as single crystals and polycrystals, etc., required for preparation of devices having excellent characteristics could not be formed easily and at low cost.

In the field of silicon on insulator (SOI) technology for growing a single-crystal on an insulating substrate, a method of forming crystals has been reported in, for example, "Extended Abstracts of the 19th SSDM 191" by T. Yonehara et al., 1987 (hereinafter referred to as "the first report"). In this method, nuclei are selectively generated by utilizing the difference in nucleation density between materials forming the surface of the substrate. Crystals are grown around the nuclei.

This crystal forming method will be described with reference to FIGS. 1 to 3.

First, as shown in FIG. 1, a substrate 401 having a surface 403 with a small nucleation density is prepared, and regions 407 and 407' with a diameter a and with a nucleation density greater than that of the surface 403 are arranged on the substrate 401 at a pitch of b.

Next, as shown in FIG. 2, the substrate 401 is subjected to a predetermined crystal forming process, whereby nuclei 409 and 409' made of a deposited substance (the substance with which the crystals are to be formed) are generated only on the surfaces of the regions 407 and 407', respectively, whereas no nuclei are generated on the surface 403. Throughout the specification, surfaces corresponding to the surfaces of the regions 407 and 407' will be referred to as "nucleation surfaces", and those corresponding to the surface 403 will be referred to as "non-nucleation surfaces".

Subsequently, as shown in FIG. 3, the nuclei 409 and 409' generated on the nucleation surfaces of the regions 407 and 407', respectively, are grown so that they grow beyond the nucleation surface regions 407 and 407' until, finally, the crystal grain 410 grown from the nucleation surface 407 abuts on the crystal grain 410' grown from the adjacent nucleation surface 407' to define a grain boundary 411.

Hitherto, the above-described crystal forming method has been performed in more than one manner. The first report described an example in which amorphous $Si_3N_4$ was the material used to form a plurality of nucleation surfaces arranged at desired positions on the substrate, while $SiO_2$ was the material used to form the non-nucleation surfaces. In this example, a Si single-crystal was formed on each nucleation surface by a chemical vapor deposition (CVD) method. Another example is reported in a second report ("The 35th Lecture Meeting on Applied Physics", 28p-M-9, 1988), in which $SiO_2$ was the material used to form non-nucleation surfaces, and a plurality of regions to provide nucleation surfaces were formed by using a focused ion beam to implant Si ions into desired positions of the non-nucleation surfaces. In this example, a plurality of Si single-crystals were formed by a CVD method.

However, the crystal forming method as described in the first report entails the following problems concerning control over the crystal formation. This is because under certain crystal growth conditions, the difference in nucleation density between $Si_3N_4$ and $SiO_2$ is insufficient, corresponding to a ratio of about 1000:1 at most.

If an insufficient difference in nucleation density between the nucleation surfaces and the non-nucleation surfaces is to be remedied by controlling the crystal forming conditions to thereby achieve a sufficient nucleation density on the nucleation surfaces, this may result in unnecessary nucleation on the non-nucleation surfaces. Conversely, if an insufficient difference is to be remedied by adopting a low nucleation density level to thereby suppress nucleation on the non-nucleation surfaces, this can result in an unnecessarily low nucleation density on the nucleation surfaces. If such is the case, some of the nucleation surfaces, where single-crystals should grow, may not have any nuclei generated thereon to grow into single-crystals. Hence, these surfaces may not be able to grow single-crystals.

If substances, such as $Si_3N_4$ and $SiO_2$, having compositions determined by stoichiometric ratios are used, the nucleation densities are determined based on a one-to-one relationship under the given crystal growth conditions. For this reason, it is sometimes difficult to determine, under certain crystal growth conditions adapted to avoid unnecessary nucleation on the non-nucleation surfaces, a particular nucleation density on the nucleation surfaces which assures that a crystal grown from a single nucleus is formed on each of the nucleation surfaces. It is also difficult to suppress, under certain crystal growth conditions adapted to assure that a nucleus is generated and grows into a single-crystal, unnecessary generation of nuclei and unnecessary growth of crystals on the non-nucleation surfaces. Thus, under certain crystal growth conditions, it is difficult to fill a large area with good-quality crystal grains, in which grain size and the grain boundary positions are successfully controlled. As a result, it is difficult to improve the yield of the crystals.

It was an intention of the crystal forming method described in the second report to eliminate the problems of the first-report method. The second method used nucleation surfaces consisting of regions where the nucleation density is increased by ion implantation employing a focused ion beam.

However, under the described circumstances, forming a plurality of nucleation surfaces by projecting a focused ion beam takes a long time. When the substrate has a large surface area, a long processing time is required, leading to a decrease in productivity which renders the second method not readily applicable. In order to overcome this drawback, a method was proposed in Japanese Patent Laid-Open No. 107016/1988, in which nucleation surfaces are formed in the following manner: a mask of a photoresist is patterned by a resist process so that it has openings only at positions corresponding to the regions where ions should be implanted; then, ion implantation is performed throughout the surface of a substrate over the mask, thereby implanting ions only in those portions of the substrate surface which are to serve as the nucleation surfaces. With this method, however, when ion implantation is performed at a high dose, the photoresist may have its properties changed in the vicinity of the openings, thereby making stripping of the photoresist difficult. Nuclei tend to be generated on any remaining photoresist and incomplete removal of the photoresist can diminish the level of control over the selective growth of crystals. As a result, a plurality of poly-crystalline grains having uncontrolled crystal grain size and uncontrolled grain boundary positions may be formed. For this reason, improvement in the yield has been sought.

In brief, none of the above efforts to overcome the problems of the method as described in the first report have proven to be sufficiently successful. They involve problems such as requiring long processing time, high cost, decrease of controllability and low yield.

The present invention solves the problem of forming crystals over non-monocrystalline substrate surfaces. In order to provide a self-matching single crystal film on a non-monocrystalline substrate, two growth factors must be controlled. The crystal growth must grow on a nucleation surface of (1) sufficiently small area and (2) of sufficient nucleation density to selectively grow only a single nucleus. The single nucleus grows to form a crystal. By patterning the nucleation surface, large grains of single crystals can be formed having well-defined and uniform grain boundaries.

SUMMARY OF THE INVENTION

Accordingly, an object of the present invention is to provide a method of forming crystals in which the difference in nucleation density between the nucleation surfaces and the non-nucleation surfaces of a substrate is sufficient to generate a nucleus on each nucleation surface, thereby improving the yield of the selective growth of crystals.

Another object of the present invention is to provide a method of forming crystals in which an ion implantation process is performed without employing a resist. Thus, in this method, there is no generation of denaturant or other unwanted substances even when a large dosage of ions are implanted.

A further object of the present invention is to provide a method of forming crystals in which selective etching is performed without using a resist. Instead, the method utilizes the difference in the etching rate between the material forming the nucleation surfaces and the material forming the non-nucleation surfaces, thus simplifying the entire process.

According to the present invention, there is a method of forming a single-crystal on a substrate comprising: (a) providing a substrate having a non-nucleation surface and a nucleation surface made of an amorphous material arranged adjacent to each other wherein the nucleation surface has a sufficiently greater nucleation density than the non-nucleation surface to selectively form a single nucleus, the nucleation surface has an area sufficiently small, that is, an area 10 μm or less in maximum diameter, to permit only one nucleus to form, which will grow into a single crystal, and the non-nucleation surface is composed of a material having a greater etching rate than the material of which the nucleation surface is composed; (b) implanting ions in the substrate; (c) selectively etching the substrate implanted with the ions such that only the non-nucleation surface is etched; and (d) growing by vapor deposition a single crystal from a single nucleus formed on the nucleation surface and the single crystal being overgrown on the non-nucleation surface.

In the present invention, the term "nucleation density" is used to mean the number of nuclei generated per unit area. The term "nuclei" means the following:

When the substrate surface (the deposition surface) is made of a material different from the atoms being projected, particularly when the surface is made of an amorphous material, the atoms projected freely diffuse over the surface of the substrate, or diffuse and re-evaporate (i.e., are desorbed). As a result of atoms colliding with each other, aggregates of atoms are formed. The free energy G of the aggregates reaches a maximum when the size of the nucleus is at the level expressed as: $r_c = -2\sigma_0/g_v$ (where $\sigma_0$ is the surface energy between each aggregate and vacuum, and $g_v$ is the free energy per unit volume). When the size of the nucleus exceeds this level, the free energy G decreases. Then, the nucleus undergoes stable and continuous three-dimensional growth and assumes the shape of an island. In the present invention, a nucleus having a size exceeding the level $r_c$ is referred to as a "stable nucleus".

The free energy G generated by the formation of the nucleus is expressed as follows:

$$G = 4\pi f(\theta) (\sigma_0 r^2 + \tfrac{1}{3} \cdot g_v r^3)$$

$$f(\theta) = \tfrac{1}{4}(2 - 3\cos\theta + \cos^2\theta)$$

where r is radius of curvature of nucleus, $\theta$ is the contact angle of nucleus, $\sigma_0$ is the surface energy between nucleus and vacuum, and $g_v$ is the free energy per unit volume.

The free energy G changes with changes in the size (the radius of curvature) of the aggregate or nucleus in the manner shown in FIG. 4. As shown in this graph, when the radius of curvature is equal to $r_c$, the free energy G is at the extreme (maximum: $G_{max}$).

DETAILED DESCRIPTION OF THE INVENTION

A method of forming crystals according to the present invention provides nucleation surface forming regions made of a nucleation surface material and non-nucleation surface forming regions made of a non-nucleation surface material having a higher etching rate than the nucleation surface material, the two different regions are positioned adjacent to each other, and ions are implanted in the nucleation surface forming regions and the non-nucleation surface forming regions. This is followed by the selective etching of the ion-implanted portions of the non-nucleation surface forming regions.

With respect to the nucleation surfaces, ion implantation in the nucleation surface forming regions enables a further improvement in the nucleation density on the nucleation surfaces. With respect to the non-nucleation surfaces, selective etching which utilizes the difference in etching rate between the material of non-nucleation surface and the material of nucleation surface enables the removal of affected layers (unnecessarily ion-implanted portions) in the non-nucleation surface forming regions which were subjected to the all-surface ion implantation. Thus, the nucleation density of the non-nucleation surfaces is prevented from being increased by ion implantation. By virtue of these arrangements, the method according to the present invention is capable of increasing the difference in nucleation density between the nucleation and non-nucleation surfaces, and is hence capable of increasing the yield of crystal formation.

Figure 1:
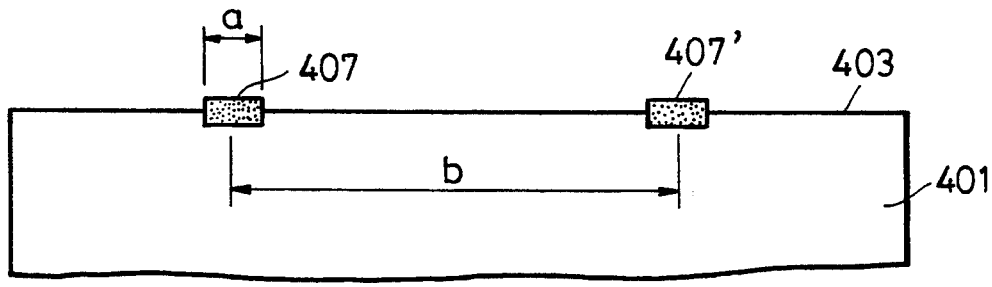
FIGS. 1 to 3 show a conventional method of forming crystals.
Figure 2:
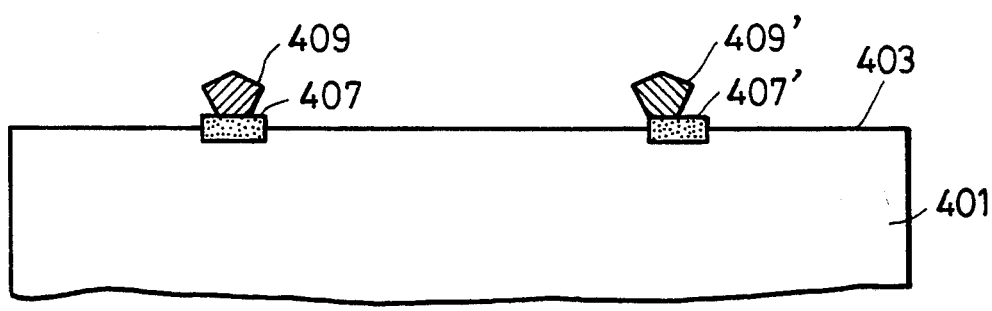
Figure 3:
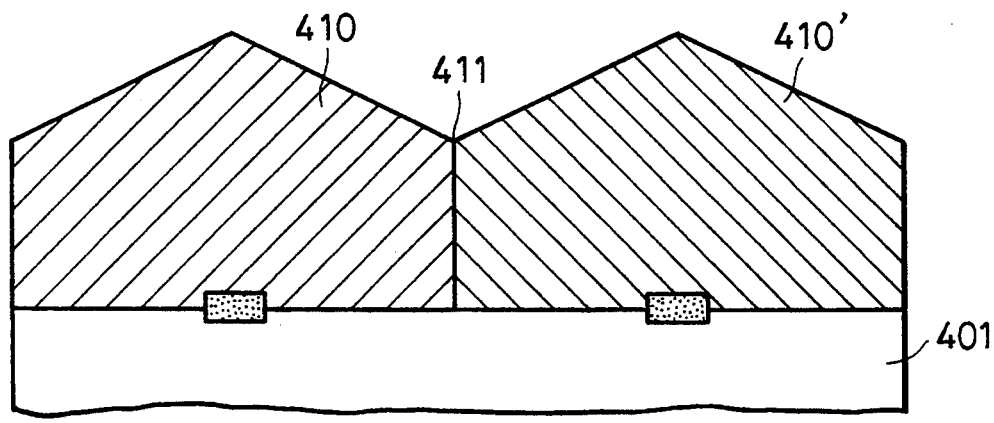
Figure 4:
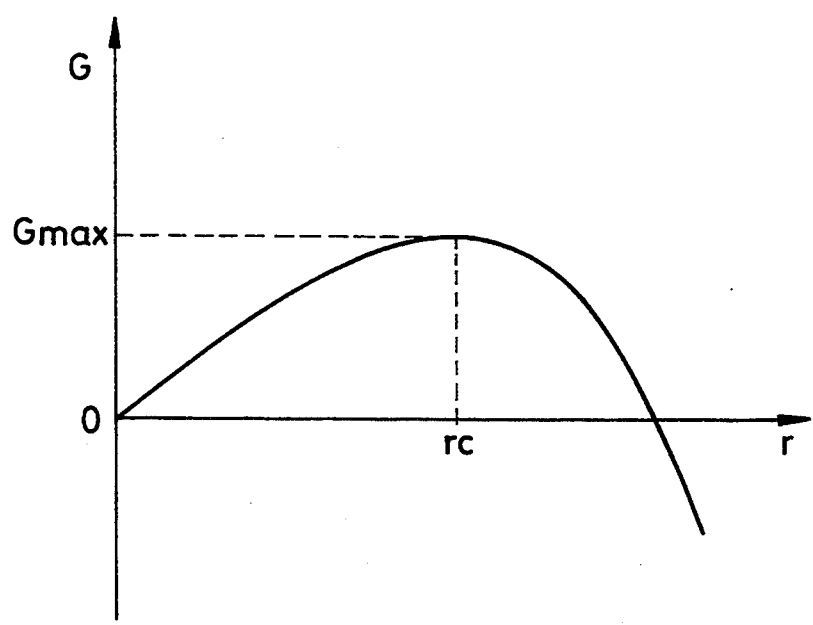
FIG. 4 is a graph showing the relationship between the size of the nucleus for forming a single crystal and the free energy.
Figure 5:
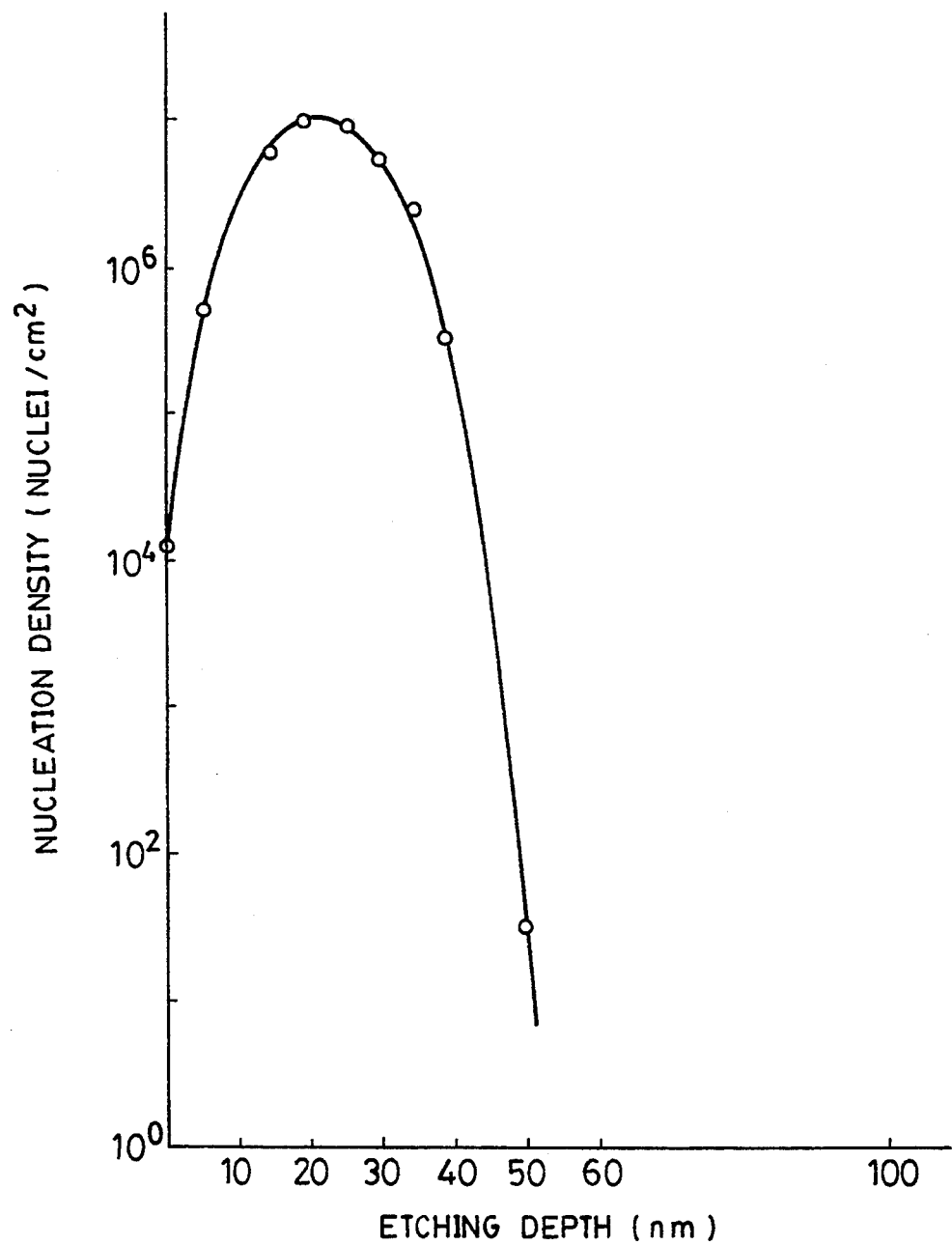
FIG. 5 is a graph showing the relationship between the depth of etching and the nucleation density.

In order to evaluate the relationship between the depth of etching and the nucleation density, experiments were performed by etching, to various depths, samples having a non-nucleation surface forming material implanted with ions. The graphic results are shown in FIG. 5. The experiments were performed under the following conditions:
Samples: 4 inch sheets of quartz glass
Implanted ion species: silicon
Acceleration voltage: 20 keV
Amount of dose: $1 \times 10^{16}$ ions/cm$^2$
When the silicon ions were implanted in the fused silica sheets under these conditions, the projection range was 21 nm. Here, the term "projection range" means the depth (the distance from the implantation surface) in which the density distribution of the ion species implanted by the ion implantation is the maximum.

As is apparent from FIG. 5, the nucleation density reaches the extreme (the maximum) when the etching depth corresponds to the projection range. When the etching depth is at least equal to about two times the projection range, the nucleation density at such a depth is lower than the nucleation density on the surface.

According to the present invention, the removal of those affected areas in the non-nucleation surface material resulting from the ion implantation is performed by selective etching without employing a resist. Instead, their removal is achieved by utilizing the difference in the etching rate. This feature is advantageous in that it is possible to completely avoid the problem of changes in the properties of the resist, conventionally caused by ion implantation. Another advantage is that, since selective etching is performed, there is no need to prepare a newly patterned resist for the etching process. Therefore, the difficult operation of removing the resist becomes unnecessary and can be accomplished without increasing the number of processes required. This method thereby improves the level of control over the generation of nuclei.

The present invention will be described in detail with reference to the drawings.

Embodiment

An embodiment of a method of forming crystals according to the present invention will be described with reference to FIGS. 6 to 10 showing the processes of the embodiment.

Figure 6:
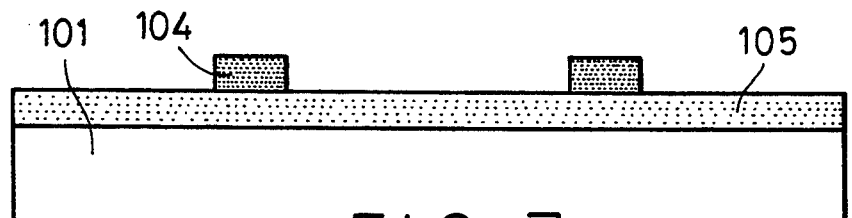
FIGS. 6 to 10 schematically show a method of forming crystals according to the present invention.

In the present invention, nucleation surfaces and non-nucleation surfaces are arranged on a substrate. A part of the substrate is made of a base material 101 which may be of any type and may have any shape so long as it is suitable for a crystal forming process. Preferable examples include a Si wafer, quartz (silica), high-melting-point glass, and metals. If the base material 101 selected is not capable of serving as a nucleation surface material or as non-nucleation surface material, nucleation surface forming region 104 and non-nucleation surface forming region 105 are formed on the base material 101 by ion implantation, as shown in FIG. 6, thereby preparing a substrate having two kinds of regions 104 and 105.

The nucleation surface material is an amorphous material having an etching rate slower than that of the non-nucleation surface material. This is because it is desired that the nucleation surface forming regions 104 remain substantially unetched even when the non-nucleation surface forming region 105 is etched to remove the upper portion 112 (the ion implanted portion) where there is a high concentration of ions unnecessarily implanted in the region 105 (see FIGS. 7 and 8).

Even if the nucleation surface forming region 104 is etched, since the region 104 has a slow etching rate, the portions of the region 104 with a high concentration of implanted ions can be maintained. This allows the nucleation surface to have a nucleation density which is at least 1000 times higher than that of the non-nucleation surface.

For this purpose, the method according to the present invention is particularly advantageous in that it is able to achieve a nucleation density of the nucleation surface material which is at least $10^3$ times the nucleation density of the non-nucleation surface material, thereby enabling crystal growth to take place with good selectivity.

In order to effect crystal growth with good selectivity, the nucleation surface preferably has a maximum diameter of not greater than 10 $\mu$m, more preferably, a maximum diameter of 0.1 $\mu$m to 5 $\mu$m. That is, the nucleation surface must be of sufficiently small area and of sufficient nucleation density to selectively grow a single nucleus only.

The nucleation surface material may be, for example, silicon nitride when the non-nucleation surface material is silicon oxide. The nucleation surface is formed by implanting ions in the nucleation surface forming region 104. The ion species implanted is preferably the same element or common element that will form the crystals to be grown. For instance, if silicon crystal is to be grown, silicon ions are implanted. However, ions that can be implanted are not limited to ions of the element that will form the crystal to be grown. Any ion species can be implanted so long as the nucleation density of the nucleation surfaces is increased by ion implantation.

The non-nucleation surface material is a material which assures a lower nucleation density of the non-nucleation surface than that of the nucleation surface, and which has a higher etching rate than the nucleation surface material. For example, the non-nucleation surface material is silicon oxide.

Figure 7:
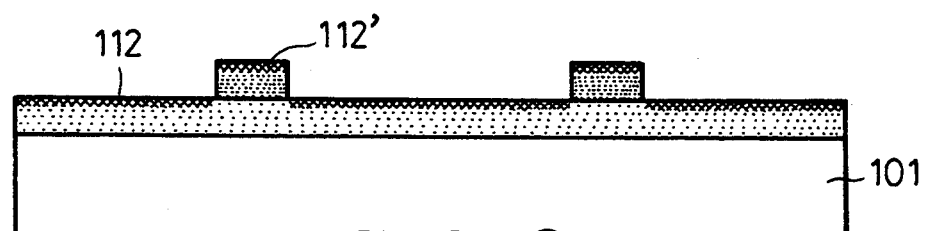

As shown in FIG. 7, ion implantation is performed over the entire surface of the substrate, on which are arranged the non-nucleation surface of the region 105 and the nucleation surface of the region 104. Region 104 has an area sufficiently small to permit only one nucleus to be generated. This single nucleus will, in a crystal forming process, grow into a single-crystal. Ions are implanted in both portions 112 and 112' of the regions 105 and 104. The ion implantation conditions, such as the acceleration voltage and the dose, are so determined as to assure a sufficiently great nucleation density of the nucleation surfaces in the portions 112'.

From the viewpoint of curtailing the time required for the subsequent etching process, the ion implantation should be performed at a low acceleration voltage so that the ion species concentration is generally high in the vicinity of the surface. The dose is at least $10^{16}$ ions/cm$^2$ when nuclei for the formation of, e.g., Si crystal, are to be generated on the nucleation surface. The acceleration voltage for the ion implantation should not exceed an allowable upper limit, which is preferably 50 keV, and more preferably 30 keV, from the view point of curtailing the time required for the etching process and improving the selectivity of the crystal formation.

Figure 11:
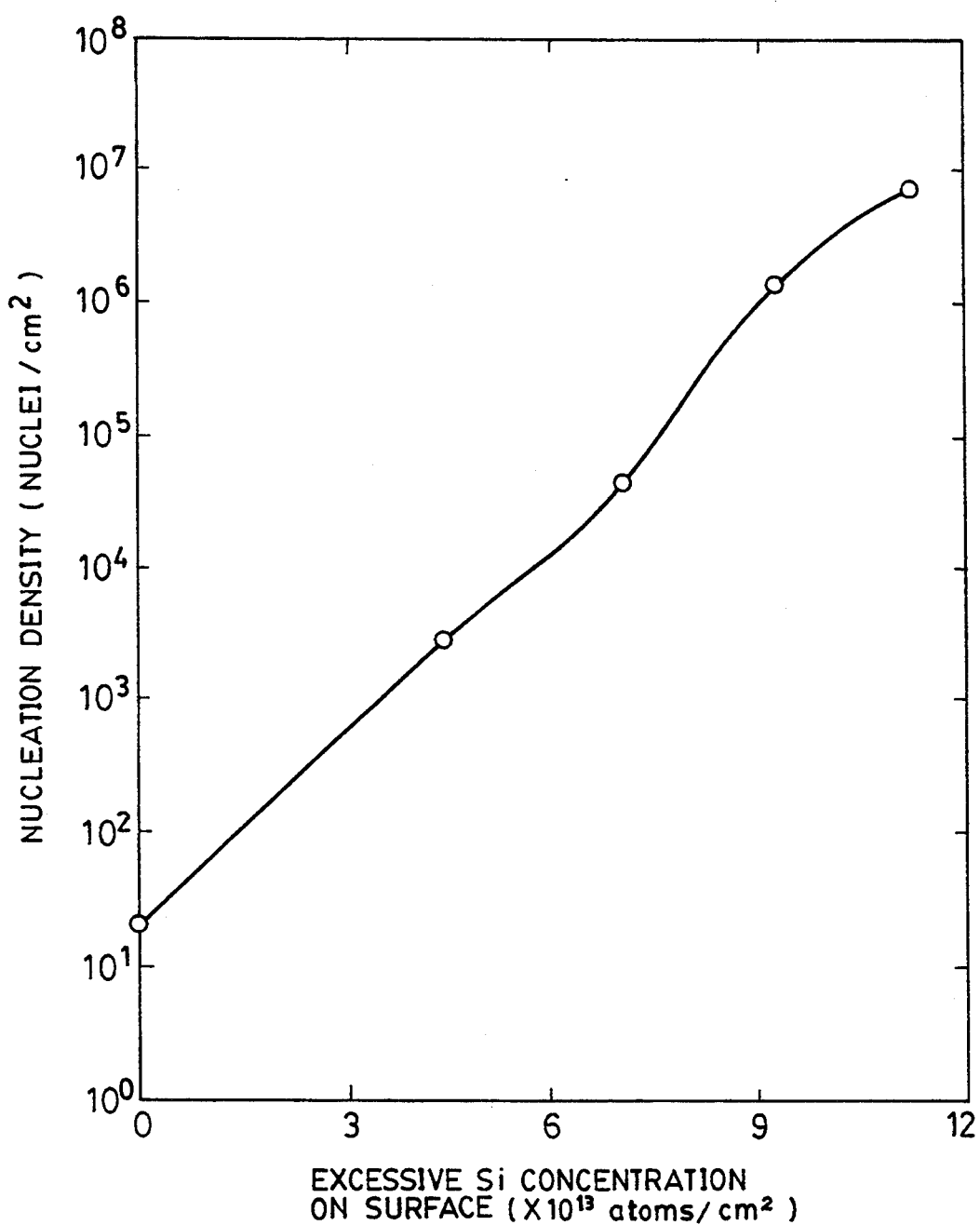
FIG. 11 is a graph showing the relationship between the concentration of silicon atoms in excess of the stoichiometric ratio on the sample surface and the nucleation density.

The nucleation density increases with increases in the concentration of the implanted ion species. An example of this relationship is shown in FIG. 11. Specifically, when silicon ions were implanted in silicon oxide sample, and when the excessive Si atom concentration on the sample surfaces was determined, the results showed that the relationship of that excessive Si concentration with the nucleation density was represented by a characteristic curve such as that shown in the graph (FIG. 11).

Ion implantation (shown in FIG. 7) causes an increase in the nucleation density of the ion-implanted portions 112 as well as in the non-nucleation surface forming regions 105. This is because the concentration of the implantated ion species increases also in the non-nucleation surface forming regions 105.

Figure 12:
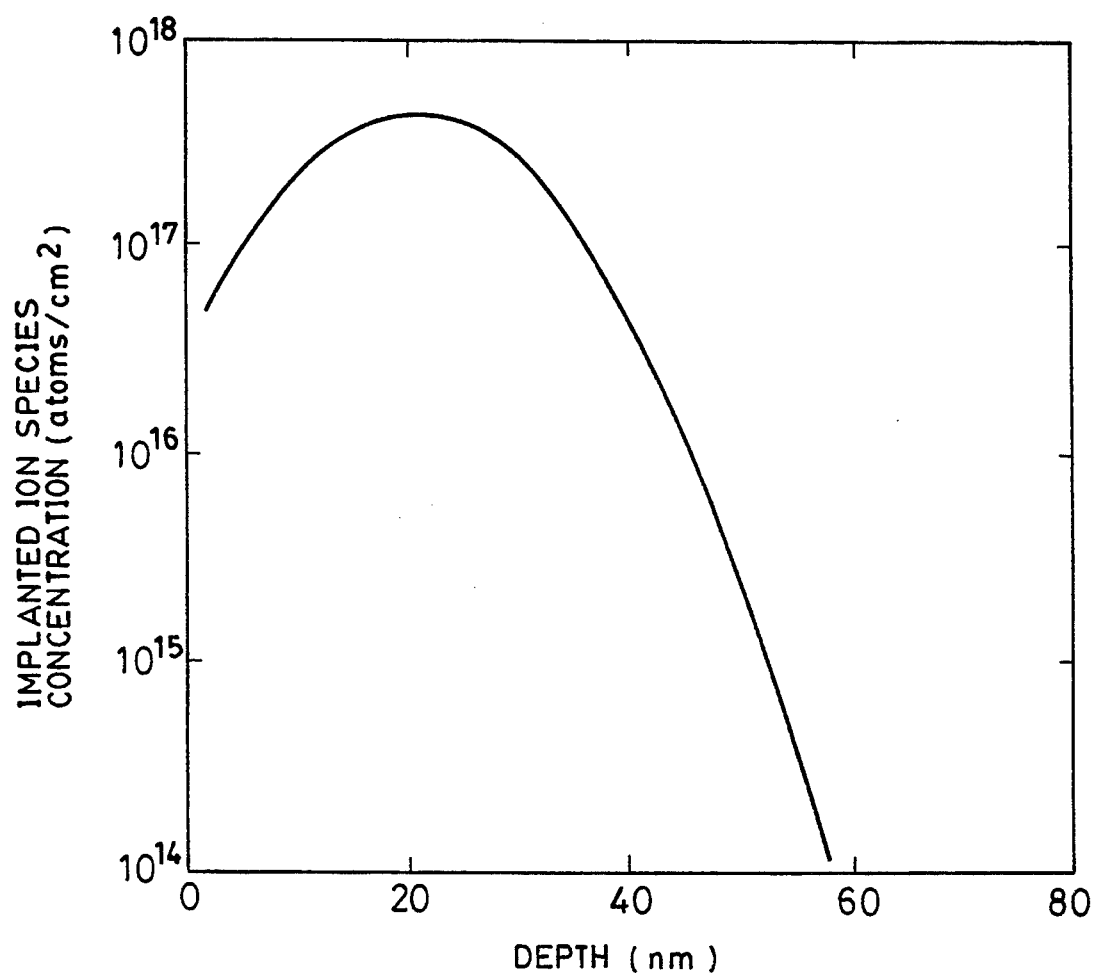
FIG. 12 is a graph showing the relationship between the depth from the substrate surface and the concentration of implanted ion species.

According to the Linhard-Scharff-Shiot (LSS) theory ("Projected Range Statistics" by J. F. Gibbons et al.; published by Halstead, New York, 1975), the ion species implanted by ion implantation are distributed at various depths of the material in the manner shown in FIG. 12. Specifically, the concentration of the implanted ion species has a distribution approximating Gaussian distribution, that is, a distribution which is determined by the type implanted ion species, the material implanted, and the acceleration voltage, and which is centered on the depth corresponding to the projection range (i.e., the depth at which the concentration of the implanted ions is the maximum).

Figure 8:
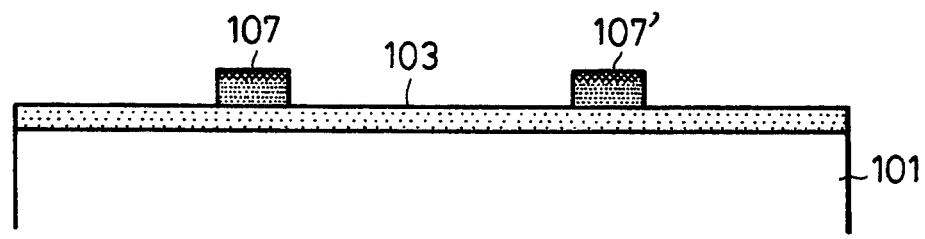

According to the present invention, as shown in FIG. 8, the non-nucleation surface forming regions 105 are selectively etched, with an etchant such as a hydrogen fluoride (HF) aqueous solution or an HF gas, to a certain depth where the concentration of the implanted ion species is low enough to avoid influencing the nucleation density. This makes it possible to hold the nucleation density of a non-nucleation surfaces 103 now exposed by the etching at a low level.

The projection range and the standard deviation of the distribution pattern of the implanted ion species are approximately determined by the implanted ion species, the surface implanted, and the implantation energy. It is desired that the depth to which the regions 105 are etched be great enough to achieve a lower concentration of the implanted ion species on the exposed surfaces than that of the unetched surfaces. For this purpose, it is desired that the etching be performed to a depth preferably corresponding to two times the projection range, and preferably more than two times the projection range. Specifically, the etching should be performed to a depth at least equal to a value which is preferably the sum of the projection range and three times the standard deviation, and preferably, the sum of the projection range and five times the standard deviation.

Specifically, when, for instance, Si ions have been implanted in nucleation surface forming regions 104 made of $Si_3N_4$ and non-nucleation surface forming regions 105 made of $SiO_2$, it is desired that the etching be performed to a depth which assures that the ion species (Si) concentration on the exposed non-nucleation surfaces 103 will preferably be not more than $5 \times 10^{13}$ $cm^{-2}$, and more preferably be not more than $2 \times 10^{13}$ $cm^{-2}$. If the difference in the etching rates selected is not sufficient, the nucleation surface material may be etched. Even in this situation, the progress of etching of the nucleation surface material is kept at a slow rate and the ion species concentration in this material be high enough to achieve a nucleation density of the resultant nucleation surfaces 107 which is higher than that of the resultant non-nucleation surfaces. The preferred ratio is 1000:1, preferably, $10^4$:1.

As long as the etching is performed so as to satisfy the above-described conditions, the etching method adopted may be any of the following methods: wet process etching employing an acid or alkali solution; dry process etching employing an etching gas such as halogenated hydrogen gas; and a reactive ion etching (RIE) method employing plasma. When, for example, the nucleation surface material is silicon nitride and the non-nucleation surface material is silicon oxide, hydrofluoric acid or the like is used. The etching rate of silicon oxide with respect to buffered hydrofluoric acid is about 500 Å/min., whereas that of silicon nitride is about 0 Å/min., rendering silicon nitride substantially unetched.

Figure 9:
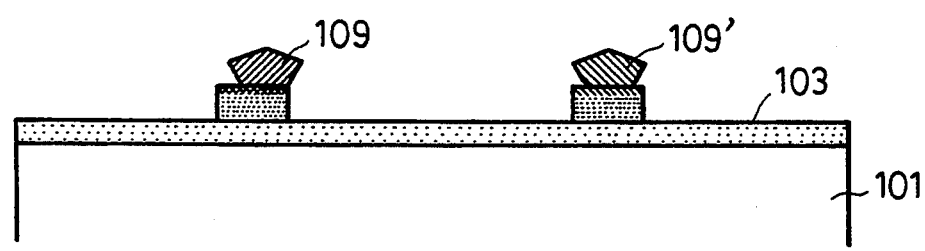
Figure 10:
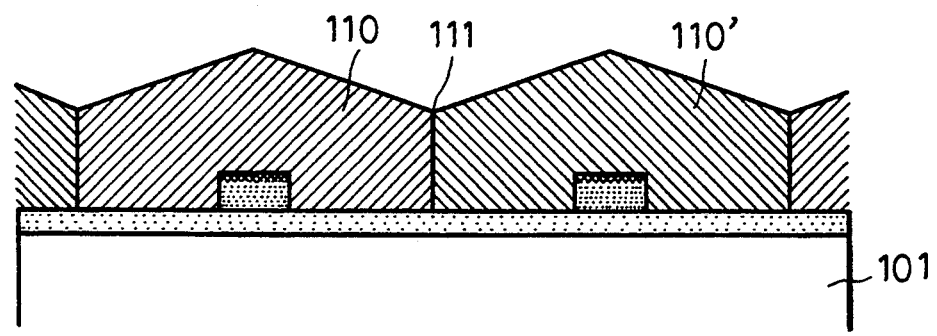

As shown in FIG. 9, the resultant substrate is then subjected to a crystal forming process. In order to allow single-crystals to be formed on the nucleation surfaces with good selectivity, the crystal forming process should desirably be a physical vapor deposition (PVD) method such as evaporation or sputtering, or a chemical vapor deposition (CVD) method such as thermal CVD, metal organic CVD (MOCVD), or plasma CVD. The crystal forming process employing such a method generates nuclei 109 and 109' on the nucleation surfaces 107 and 107', respectively, which will grow into single-crystals. Finally, as shown in FIG. 10, the nuclei are grown, thereby forming single-crystals 110 and 110' which have grown, starting at the nucleation surfaces 107 and 107', until they abut on each other to define a crystal grain boundary 111.

EXAMPLES

The method according to the present invention will now be described by way of examples, a first example described with reference to FIGS. 13 to 17 and a second example described with reference to FIGS. 18 to 22. In these drawings, parts corresponding to those in the above-described embodiment of the present invention are denoted by the same reference numerals as those in FIGS. 6 to 10.

EXAMPLE 1

In Example 1, a plurality of Si single-crystals were formed by the method according to the present invention in the following manner.

Figure 13:
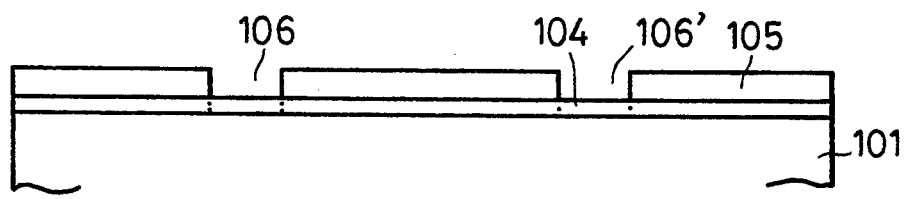
FIGS. 13 to 22 schematically show examples of the crystal forming method according to the present invention.

(1) As shown in FIG. 13, a Si wafer was used as a base material 101. An amorphous silicon nitride film, used to form nucleation surface forming regions 104, was deposited on the base material 101 to a thickness of 1000 Å by a conventional low-pressure CVD (LPCVD) method by using dichlorosilane ($SiH_2Cl_2$) and ammonia ($NH_3$). Then, a silicon oxide film, used to form non-nucleation surface forming region 105, was deposited on the silicon nitride film to a thickness of 2000 Å by a normal atmospheric-pressure CVD method under the conditions of: silane, 45 sccm; oxygen, 60 sccm; and substrate temperature, 400° C. Subsequently, the silicon oxide film was etched by first performing a resist process used in usual semiconductor procedure, and then performing an etching process. The resist process was performed in such a manner that parts of the silicon nitride film, each being 2 μm square, would be exposed at lattice points spaced apart from one another by 40 μm. The etching process was a conventional etching process employing a buffered hydrofluoric acid having an HF concentration of 4.5 wt % and a liquid temperature of 20° C. As a result of the etching, openings 106 and 106' were formed in the silicon oxide film, thereby preparing a substrate having nucleation surface forming regions 104 and non-nucleation surface forming regions 105.

Figure 14:
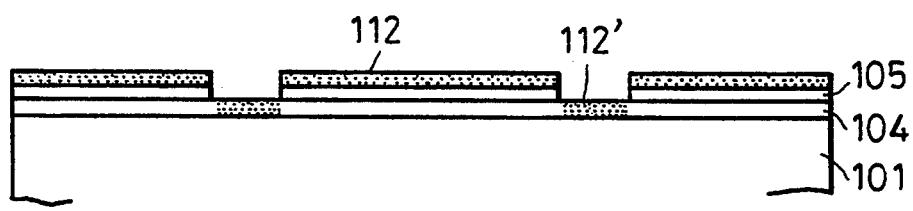

(2) As shown in FIG. 14, Si ions were implanted in the entire surface of the substrate at an acceleration voltage of 10 keV and at a dosage of $1 \times 10^{16}$ ions $cm^{-2}$ thereby producing ion-implanted portions 112 and 112' in the regions 105 and 104, respectively. The projection range of the implanted ions was 114 Å, and the standard deviation of the distribution of the implanted ions was 52 Å.

Figure 15:
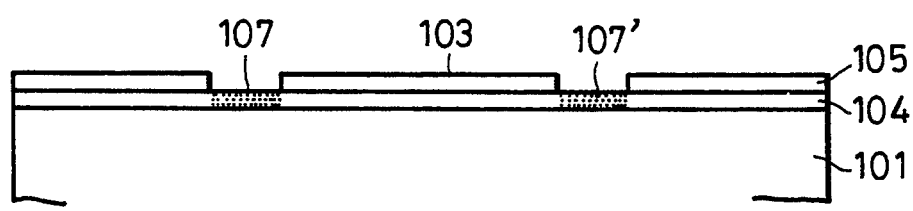

(3) As shown in FIG. 15, the resultant substrate was submerged for two minutes in buffered hydrofluoric acid of the same type as used above, thereby etching the ion-implanted silicon oxide film to the depth of 1000 Å. No part of the silicon nitride film was found to be etched by this etching procedure. The nucleation density of the nucleation surfaces 107 and 107' was found to be about $10^5$ times the nucleation density of the non-nucleation surfaces 103 exposed by the etching to the depth of 1000 Å, thereby achieving a difference in nucleation density between the two kinds of surfaces which was much greater than the conventionally achieved difference.

Figure 16:
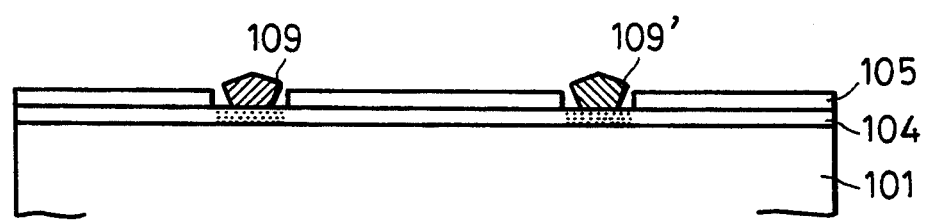

(4) Subsequently, the resultant substrate was placed in a CVD reactor, then subjected to a crystal growth process by a thermal CVD method under the conditions of a pressure being 150 Torr, the ratio in flow (1/min) of gases $SiH_2Cl_2$, HCl and $H_2$ being 0.53:1.8:100, and a substrate temperature being 990° C. As a result, as shown in FIG. 16, nuclei 109 and 109' which could be grown into single-crystals with good selectivity, were formed on the respective nucleation surfaces 107 and 107'. The good selectivity was obtained due to the fact that a much greater difference (than the conventional level) was achieved between the respective nucleation densities of the nucleation and non-nucleation surfaces.

Figure 17:
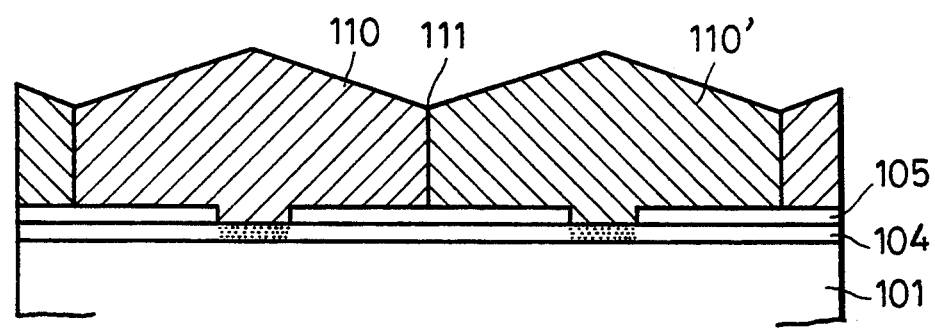

The crystal growth by vapor deposition was continued whereby silicon a single-crystal 110 and a silicon single-crystal 110' each having a size of 40 μm were grown, respectively, from single nucleus 109 and single nucleus 109'. The growth began starting at the adjacent nucleation surfaces 107 and 107', respectively, until the single-crystals abutted on one another, as shown in FIG. 17. The grown crystals 110 and 110' defined a grain boundary 111 at a substantially intermediate position between the nucleation surfaces 107 and 107'. An examination was made to determine whether any error crystals were formed by unnecessary generation of, and growth of, nuclei on the non-nucleation surfaces 103 and no formation of such error crystals was observed. Nor was there any observation of the formation of poly-crystalline error crystals on the nucleation surfaces where single-crystals should be formed.

Thus, in Example 1, single-crystals were formed with good selectivity, and having a grain size and a grain boundary position which were both successfully controlled.

EXAMPLE 2

In Example 2, a plurality of Si single-crystals were formed in the following manner.

Figure 18:
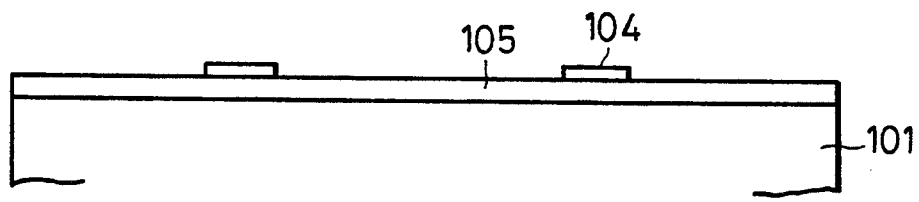

(1) As shown in FIG. 18, a Si wafer was used as a base material 101. A silicon oxide film, used to form non-nucleation surface forming regions 105, was formed on the base material 101 to a thickness of 2000 Å by subjecting the material 101 to a conventional thermal oxidation method for 55 minutes under the conditions of: substrate temperature, 1000° C.; hydrogen, 4 slm; and oxygen, 2 slm. Then, an amorphous silicon nitride film, used to form nucleation surface forming regions 104, was deposited on the silicon oxide film to a thickness of 300 Å by a conventional LPCVD method by using dichlorosilane (20 sccm) and ammonia (80 sccm) under the conditions of a substrate temperature of 800° C. and a pressure of 0.3 Torr. Subsequently, the silicon nitride film was etched by first performing a resist process used in usual semiconductor procedure, and then performing a reactive ion etching process employing HF gas plasma. The resist process was performed in such a manner that parts of the silicon nitride film, each being 2 μm square, would be positioned at lattice points spaced apart from one another by 80 μm. As a result of the etching, a substrate having nucleation surface forming regions 104 and non-nucleation surface forming regions 105 was prepared.

Figure 19:
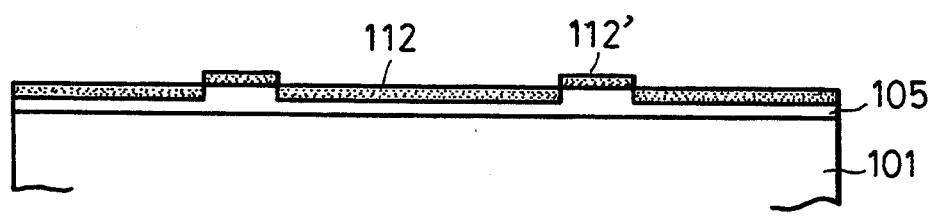

(2) As shown in FIG. 19, Si ions were implanted in the entire surface of the substrate at an acceleration voltage of 10 keV and at a dosage of $1 \times 10^{16}$ ions/cm², thereby producing ion-implanted portions 112 and 112' in the regions 105 and 104, respectively.

Figure 20:
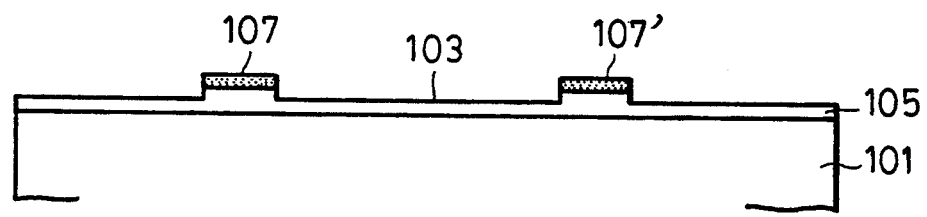

(3) As shown in FIG. 20, the resultant substrate was submerged for two minutes in buffered hydrofluoric acid having an HF concentration of 4.5 wt % and a liquid temperature of 20° C., thereby etching the ion-implanted silicon oxide film to the depth of 1000 Å. No part of the silicon nitride film was found to be etched by this etching procedure. The nucleation density of the nucleation surfaces 107 and 107' was found to be about $10^5$ times the nucleation density of the non-nucleation surfaces 103 exposed by the etching to the depth of 1000 Å.

Figure 21:
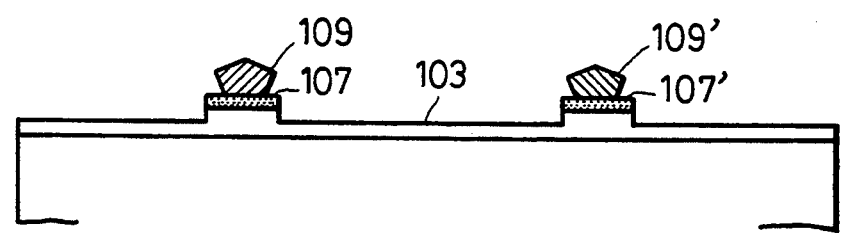
Figure 22:
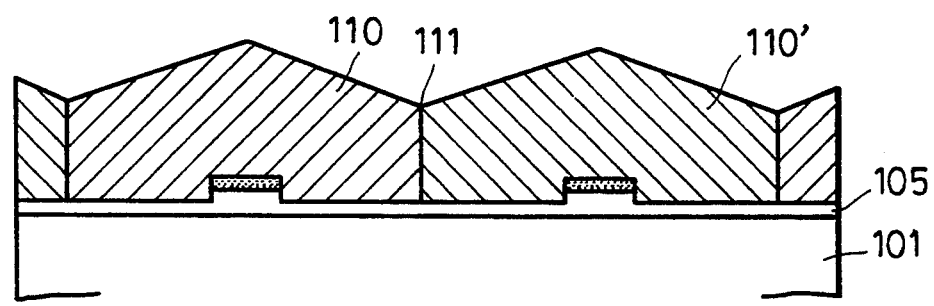

(4) This difference in nucleation density between the nucleation and non-nucleation surfaces, which was much greater than the conventionally achieved difference, allowed nuclei 109 and 109' to form on the respective nucleation surfaces 107 and 107', as shown in FIG. 21, and to grow into single-crystals with good selectivity. Crystal growth was effected by performing for 90 minutes a thermal CVD method under the same conditions as those described above. As a result, as shown in FIG. 22, silicon single-crystals 110 and 110' having a size of 80 μm were grown, starting at the adjacent nucleation surfaces 107 and 107', respectively, until the single-crystals abutted on one another. The abutting single-crystals 110 and 110', grown from single nucleus 109 and single nucleus 109', respectively, defined a grain boundary 111 at a substantially intermediate position between the nucleation surfaces 107 and 107'. An examination was made to determine whether any error crystals were formed. The results showed that no error crystals formed by unnecessary generation of nuclei on the non-nucleation surfaces 103, nor poly-crystalline error crystals on the nucleation surfaces where single-crystals should be formed were observed.

As described above, the method of forming crystals according to the present invention is capable of increasing the nucleation density of the nucleation surfaces by implanting ions in the substrate surface without employing a resist. Further, since the affected layers (unnecessarily ion-implanted portions) resulting in the non-nucleation surface forming regions from ion implantation can be removed by a selective etching, whereby only the non-nucleation surface material is effected. These features make it possible to achieve a sufficiently great difference between the respective nucleation densities of the nucleation and non-nucleation surfaces. The ion implantation process that does not employ a resist renders the method completely free from the problems conventionally caused by ion-implantation using a resist, such as a lowered level of selectivity of the crystal growth. The selective etching which utilizes the difference between the respective etching rates of the nucleation and non-nucleation surface materials does not require the process of patterning a resist.

What is claimed is:

1. A method for forming a single crystal on a substrate comprising:
   (a) providing a substrate having an amorphous nucleation surface and a non-nucleation surface arranged adjacent to each other wherein said amorphous nucleation surface has an area of 10 μm or less in maximum diameter and a nucleation density sufficiently larger than the nucleation density of said non-nucleation surface to selectively form a single nucleus; and said non-nucleation surface is composed of a material of greater etching rate than that of said nucleation surface;

(b) implanting ions over the entire surface of said substrate so as to implant ions in said amorphous nucleation surface and said non-nucleation surface, said ions being capable of increasing the nucleation density of said nucleation surface;

(c) etching said substrate such that only the non-nucleation surface implanted with ions is selectively etched to remove the ion-implanted portions on said non-nucleation surface, thereby preventing the nucleation density of said non-nucleation surface from increasing;

(d) growing by vapor deposition a single crystal from a single nucleus deposited on said nucleation surface, said single crystal being overgrown on said non-nucleation surface.

2. A method of forming a single crystal according to claim 1, wherein said non-nucleation surface is constituted of silicon oxide.

3. A method of forming a single crystal according to claim 1, wherein said nucleation surface is constituted of silicon nitride.

4. A method of forming a single crystal according to claim 1, comprising implanting silicon ions as the ion in said ion implantation process.

5. A method of forming a single crystal according to claim 1, comprising etching the non-nucleation surface to a depth at least two times the depth at which have maximum concentration of implanted ions.

* * * * *

UNITED STATES PATENT AND TRADEMARK OFFICE
CERTIFICATE OF CORRECTION

PATENT NO. : 5,363,793
DATED : November 15, 1994
INVENTOR(S) : NOBUHIKO SATO

It is certified that error appears in the above-identified patent and that said Letters Patent is hereby corrected as shown below:

ON TITLE PAGE

In [56] References Cited, under U.S. PATENT DOCUMENTS:
"3,620,833  11/1971  Gheim" should read
--3,620,833  11/1971  Gleim--.

COLUMN 1

Line 8, "(1) Field" should read --1. Field--.
Line 25, "(2) Related" should read --2. Related--.
Line 66, "De" should read --be--.
Line 67, "Mathews et" should read --Mathews et al.--.

COLUMN 4

Line 25, "De" should read --be--.

COLUMN 13

Line 17, "silicon a" should read --a silicon--.

UNITED STATES PATENT AND TRADEMARK OFFICE
CERTIFICATE OF CORRECTION

PATENT NO. : 5,363,793

DATED : November 15, 1994

INVENTOR(S) : NOBUHIKO SATO

It is certified that error appears in the above-identified patent and that said Letters Patent is hereby corrected as shown below:

COLUMN 16

Line 14, "have" should read --there is a--.

Signed and Sealed this

Eighteenth Day of April, 1995

Attest:

BRUCE LEHMAN

*Attesting Officer*  *Commissioner of Patents and Trademarks*